3,817,758
GOLD ALLOY METALLIZATIONS FOR CAPACITOR ELECTRODES

Oliver Alton Short, Wilmington, Del., assignor to E. I. du Pont de Nemours and Company, Wilmington, Del.

No Drawing. Continuation-in-part of application Ser. No. 260,244, June 6, 1972, now Patent No. 3,756,834, which is a continuation-in-part of abandoned application Ser. No. 136,190, Apr. 21, 1971, which is a continuation-in-part of abandoned application Ser. No. 873,055, Oct. 31, 1969, which is a continuation-in-part of abandoned application Ser. No. 705,305, Feb. 14, 1968, which in turn is a continuation-in-part of abandoned application Ser. No. 626,394, Mar. 28, 1967. This application Jan. 22, 1973, Ser. No. 325,624
The portion of the term of the patent subsequent to Sept. 14, 1990, has been disclaimed
Int. Cl. C09d *5/24*
U.S. Cl. 106—1 4 Claims

ABSTRACT OF THE DISCLOSURE

Powder compositions comprising certain ternary alloy particles useful in making ceramic capacitor electrodes and capacitors thereof. The specific alloys are 5–15% platinum, 15–30% palladium and 60–80% gold.

CROSS-REFERENCE TO RELATED APPLICATIONS

This is a continuation-in-part of my U.S. patent application Ser. No. 260,244, filed June 6, 1972, now U.S. Pat. No. 3,756,834; which is a continuation-in-part of my application Ser. No. 136,190, filed Apr. 21, 1971, now abandoned; which is a continuation-in-part of U.S. patent application Ser. No. 873,055, filed Oct. 31, 1969, now abandoned; which is a continuation-in-part of U.S. patent application Ser. No. 705,305, filed Feb. 14, 1968, now abandoned; which is a continuation-in-part of U.S. patent application Ser. No. 626,394, filed Mar. 28, 1967, now abandoned.

BACKGROUND OF THE INVENTION

Metallizing compositions which are printed on prefired (sintered) ceramic dielectrics and fired thereon to form capacitor electrodes customarily contain finely divided noble metal particles, a finely divided inorganic binder, and an inert vehicle. A major purpose of the inorganic binder is to adhere the fired-on noble metal particles to the ceramic dielectric substrate. To provide this function, a firing temperature must be employed which causes the inorganic binder in the composition to soften and wet the ceramic dielectric substrate. It has been observed that greater adhesion of fired metallization to substrate can be obtained at higher firing temperatures.

Metallizing compositions which are printed on green (unfired) ceramic dielectric substrates normally contain no inorganic binder; consequently, the dielectric substrated (having a metallizing composition printed thereon) must be fired to its sintering temperature to bond the metal to the dielectric substrates and to cement the dielectric substrates into a monolithic block. However, when temperatures equal to or in excess of the melting point of the noble metal particles of the metallizing composition are used on unfired (or prefired) ceramic dielectrics, the metal particles draw back into globules, forming electrically noncontinuous fired-on coatings and hence defective electrical elements. To avoid the formation of these undesirable metal globules while using metallizing compositions containing the more abundant and less expensive noble metals such as gold and silver, which melt at 1062° C. and 960° C., respectively, lower firing temperatures must be used. The industry has recently demanded electrical capacitors which cannot be produced by using silver or gold powder alone, because of the need for higher firing temperatures.

For such capacitors the industry has demanded a dielectric material having a higher dielectric constant than that of glass ceramic. It has become necessary to form the dielectric of a material having a much higher fusing temperature than that of glass. Substances such as barium or strontium titanate or titanium dioxide, having a sintering temperature of over 1200° C., are necessary for this purpose. With such dielectrics, finely divided noble metal powders such as gold or silver cannot be used, since they fuse at temperatures over 960° C. and 1062° C., respectively, and draw into fine globules to produce noncontinuous electrode layers. A metallizing composition which can be fired at higher temperature must be utilized. Noble metal powders of platinum, palladium, or similarly expensive noble metals have been the only materials heretofore available to be fired at the higher temperatures. However, noble metal powders which contain the less expensive of the higher firing metals, palladium, cannot be used on dielectrics which contain bismuth stannate for the reasons discussed hereafter.

Capacitors are prepared by printing noble metal metallizing compositions on sheets of resin-bonded, unfired (green) ceramic dielectrics. Many of these dielectric layers may be stacked on top of each other to produce multilayer assemblies, which are ultimately fired to produce monolithic ceramic capacitors. In the fabrication of ceramic dielectrics, many different ceramic formulations have been used to obtain different values of dilectric constant, dissipation factor, and temperature characteristics. One of the common constituents utilized in such formulations and mixed with alkaline earth titanates for control of electrical characteristic is bismuth stannate. It is common practice in the capacitor industry to use palladium as the electrode material, when the dielectric contains no bismuth stannate and to use platinum when the dielectric contains bismuth stannate. Palladium is used for reasons of economy when this metal is acceptable, but a chemical reaction occurs between palladium of the electrode and bismuth stannate of the dielectric substrate which causes delamination or complete disruption of the capacitor. This necessitates the use of the much more expensive platinum in the presence of this additive (bismuth stannate).

Dielectrics containing bismuth stannate are usually formulated from barium, stronium or calcium titanate and 0.1–12% by weight of bismuth stannate. A reaction between the bismuth stannate and palladium, probably involving a transfer of oxygen from the bismuth stannate to the palladium and subsequent release from the palladium in the range of 800° C., causes delamination or complete disruption of built up monolithic capacitors. Other possible additives to dielectrics which would act similarly when added in the same amounts as discussed above are bismuth oxide, tin oxide, zinc oxide, lead oxide, cadmium oxide, indium oxide, thallium oxide, and copper oxide. Platinum does not undergo this oxygen exchange and is a satisfactory electrode material but costs considerably more and is therefore not as economically desirable. It is well known that a slight economy can be made by blending about 20% palladium powder or gold powder with 80% platinum, but this is not sufficiently attractive in view of the complexity of forming mixed binary pastes.

More recently, binary noble metal alloys have been utilized, as disclosed by Hoffman U.S. Pat. 3,385,799. While the results obtained in accordance with the Hoffman invention are better than the prior art, there is still a need for metallizations which produce an excellent overall combination of electrical properties, sintering temperature, nonreactivity, and low cost.

Thus, there is a definite need for a metallizing composition and electrodes which can be fired at high temperatures, and thus, avoid the formation of undesirable metal globules. In addition, there is a strong need for a metallizing composition and electrodes which are relatively inexpensive and can be fired on ceramic dielectrics which contain bismuth stannate, oxides of bismuth and tin or other oxides listed above. This invention covers a series of alloy metallizing compositions that can be successfully and relatively inexpensively used to form fired-on electrodes on bismuth stannate-containing dielectric substrates, and capacitors therefrom. Such a need has been met by the alloy metallizations claimed in my above-mentioned copending application U.S. Ser. No. 260,244, with respect to certain firing temperature requirements, e.g., they are useful at 1260° C. and even at much higher firing temperatures such as 2400–2500° F. (1315–1370° C.). However, recently certain lower firing ceramics have been developed and come into commercial usage; these do not require such high sintering temperatures and may be fired in the range of 1100–1260° C. These ceramics are of alkaline earth titanates containing appreciable quantities of low melting materials such as bismuth stannates, along with various niobates (e.g., lead niobate) and rare earth oxides such as cerium oxide. Thus, a lower melting, less expensive, yet relatively unreactive metallization, is desired by the industry.

SUMMARY OF THE INVENTION

This invention relates to noble metal alloy metallizing compositions comprising an inert liquid vehicle having dispersed therein finely divided alloy particles. The particles consist essentially of by weight 5–15% platinum, 15–30% palladium and 60–80% gold, which can be printed and fired to form capacitor electrodes on ceramic dielectrics. Such capacitors comprise at least one electrode and at least one counterelectrode having a layer of a ceramic dielectric material between the electrode(s) and counterelectrode(s), wherein said electrode and counterelectrode comprise an alloy of, on a weight basis, 5–15% platinum, 15–30% palladium and 60–80% gold, wherein the alloy particles are irregularly shaped and the alloy powder has an average surface area within the range 0.1–20 $m.^2/g$. The alloy metals in the metallizing compositions and capacitor electrodes of this invention are characterized as not undergoing excessive oxygen exchange with base metal oxides (particularly the oxides of bismuth and tin) under firing conditions and thus being suitable for printing and firing on bismuth stannate-containing dielectrics. Therefore, when bismuth stannate-containing dielectric substrates are used in capacitors, the alloy metallizing compositions and alloy electrodes of this invention do not encounter the prior art problems involving the oxygen transfer from substrate metals to the electrode metals which causes delamination or complete disruption of built up monolithic capacitors. Additionally, these alloy compositions provide an excellent overall combination of electrical properties in various electronic products.

DETAILED DESCRIPTION

The particular metallizing compositions which are printed and fired to form electrodes on ceramic dielectrics are based on certain finely divided alloys. The alloys consist essentially of 5–15% platinum, 15–30% palladium and 60–80% gold.

In the alloys of the metallizations of the present invention, the high melting point noble metals Pt and Pd are desirable so that the substrate and the metallization thereon can be cosintered without melting of the conductor. The amount of Pt, however, should not exceed 15% for reasons of cost. At least 5% Pt should be present due to its nonreactivity with the substrate and its melting point elevation effect. If the sintering temperature of the ceramic is sufficiently low, ternary alloys are not needed since the lowest cost palladium-gold binary is satisfactory, but in the 1100–1260° C. firing range, at least 5% platinum is required. The maximization of Pd content in the alloy is desired due to its lower cost, coupled with its high melting point. A minimum of 15% Pd in the alloy provides a significant increase in alloy melting point versus noble metals such as gold; however, Pd should not exceed 30% of the alloy weight when using ceramics containing 5–15% bismuth stannate and other low-melting additives due to the considerations of reactivity of Pd with these easily reducible additives. Substrate reactivity may lead to blistering and delamination, or even shattering, of capacitors, with alloys having more than 30% Pd; this is related to the levels of easily reducible oxide additives such as bismuth stannate.

Gold is present as 60–80% of the alloy. Gold, when substituted for Pt in the alloy, does not exhibit the reactivity problem shown by excess Pd, and at least 60% gold is present to serve the function of minimizing reactivity with the substrate, as well as to reduce alloy cost. However, gold has a severe melting point depression effect upon the alloy (since gold melts at 1062° C.). At levels above 80% of the alloy, the melting point depressant effect of gold is too severe.

Preferred alloys contain Pt/Pd/Au in the following proportions, by weight: 10/20/70, 15/25/60 and 7.5/22.5/70.

The metallizing compositions of this invention, in addition to being useful in the formation of capacitors, may also be used in forming electrically conductive paths (i.e., conductors) and electrically resistive paths (i.e., resistors).

The surface area of the alloy powder is a critical feature of this invention. As indicated above, the average surface area must be within the range of 0.1–20 $m.^2/g$. Alloy particles having a surface area less than 0.1 $m.^2/g$. produce either low capacitance, poor reproducibility and/or open circuits. On the other hand, alloy powders having a surface area greater than 20 $m.^2/g$. produce high viscosity dispersions (pastes) which cannot be screen printed. Powders finer than 20 $m.^2/g$. also have a tendency to "cake" and catalytically react with the vehicle and/or substrate. Therefore, the surface area of the alloy powders must be within the critical range set forth above in order to be within the scope of this invention.

The alloy powders may be prepared as follows. Sufficient metal compounds, preferably in the form of acidic chloride solutions, are mixed to produce the desired ratio of metals in the alloy to be formed. The metals are precipitated as hydroxides and ammonia complexes by adding diluted ammonium hydroxide until the pH is between 8 and 11. The mixed metal hydroxides and complex chlorides are then reduced with a reducing agent (e.g., hydrazine, hydroquinone) to yield the alloy powder. The coprecipitation method is the preformed procedure to produce the alloy powders.

The metallizing compositions of the invention will usually, although not necessarily, be dispersed in an inert vehicle to form a paint or paste for application to ceramic dielectrics. Additionally, a finely divided inorganic binder (typically up to 15% of total solids content) may optionally be added to the metallizing composition if printing in prefired ceramic bodies is contemplated, to enhance adhesion of the fired alloy to the substrate. The proportion of vehicle to solids (metal alloys, inorganic binder) may vary considerably depending upon the manner in which the paint or paste is to be applied and the kind of vehicle used. Generally, 10–90% by weight of vehicle will be used to produce a paint or paste of the desired consistency. Any liquid, preferably one that is inert towards the alloy powder, may be employed as the vehicle. Water or any of various organic liquids, with or without resin binders, thickening and/or stabilizing agents, and/or other common additives may be utilized as the vehicle. Examples of organic liquids that can be used when these alloys are printed on prefired ceramics are esters of higher alcohols, for example, the acetates and propionates; the terpenes such as pine oil, terpineol and the like; and solutions of resin binders such as the polymethacrylates of lower alcohols, or solutions of ethyl cellulose, and solvents such as pine oil and the monobutyl ether of ethylene glycol monoacetate (butyl—O—$CH_2CH_2$—$OCOCH_3$). A preferred vehicle for use in this invention on unfired ceramic sheets consists of hydrogenated rosin, ethyl cellulose, beta-terpineol, and kerosene. Such vehicles are disclosed in Short U.S. Pat. 3,536,500.

While metallizing compositions which are applied to green (unfired) dielectric substrates customarily consist essentially of metal powder and a vehicle, the metallizing compositions which are applied to pre-fired ceramic substrates usually contain inorganic binder, in addition to the metal powder and inert vehicle. Also, inorganic binders are used in resistor and conductor compositions. The inorganic binders used in the metallizing compositions of this invention may be composed of any glass or ceramic material which will melt at a temperature lower than the melting point of the alloy powder with which it is used and which will adhere well to the substrate onto which the metallizing composition is applied. Barium titanate is a preferred inorganic binder for capacitor electrodes. The high melting point alloy powders used in the metallizing compositions of this invention will enable the metallizing compositions to be fired to higher temperatures than are possible when physical mixtures of the pure corresponding metals are used. It has been observed that greater adhesion to the substrate can be achieved with the higher temperatures which are made possible by the use of alloy powders. Any inorganic material which serves to bind the metals to the substrate can be used as the inorganic binder component. The inorganic binder can be any of the glass frits employed in metallizing compositions. Such frits are generally prepared by melting a glass batch composed of the desired metal oxides, or compounds which will produce the glass during melting, and pouring the melt into water. The coarse frit is then milled to a powder of the desired fineness. Larsen and Short U.S. Pat. No. 2,822,279 and Hoffman U.S. Pat. No. 3,207,706 both describe frit compositions which can be employed either alone or in combination with glass wetting agents, such as bismuth oxide. Typical frit compositions usable as binders in the compositions of this invention include lead borate, lead silicate, lead borosilicate, cadmium borate, lead-cadmium borosilicate, zinc borosilicate, and sodium-cadmium borosilicate frits. The average particle size of the inorganic binder should be no larger than 40 microns, preferably within the range of 1–5 microns.

A preferred composition range for the alloys of this invention is 5–15% Pt, 15–25% Pd and 60–70% Au.

The present metallizing compositions can be printed and fired on various types of ceramic dielectrics including those composed of forsterite, steatite, beryllium oxide, titanium oxide, barium titanate, alumina or zircon porcelain. Any other conventional unfired (green) dielectric or prefired dielectrics can be used. Of course, their most important utility is for use on the newly developed ceramic compositions described above.

The following examples are given to illustrate in detail the preferred method of preparing alloy particles in accordance with the teachings of this application; it is pointed out that these details are not to be taken as limitations of this invention. In the examples and elsewhere in this application, all parts, percentages and ratios are by weight.

EXAMPLES

Aqueous solutions containing three chloride salts were prepared, i.e., $PtCl_2$, $PdCl_2$ and $AuCl_3$. A batch containing these chloride solutions was prepared, the metals (as the chloride) being present in the solution in the relative proportions desired in the alloy, in an amount to produce 75 grams of alloy. Thus, where a 10/20/70 Pt/Pd/Au alloy is desired, the ratio of Pt/Pd/Au in the solution would be 10/20/70. The total volume of the solution was adusted to 560 ml. with water.

The solution was placed in an 8 liter battery jar equipped with an air-driven paddle stirrer. The following solutions were prepared: (A), 300 ml. of concentrated (15 N) $NH_4OH$ and 450 ml. water; (B), 300 ml. of concentrated (15 N) $NH_4OH$; (C) and (D), each 15 grams of hydrazine sulfate in 300 ml. water; and (E), 45 grams of hydrazine sulfate in 900 ml. water.

(A) was added to the mixed chloride solution in the battery jar; 30 seconds later (B) was added; at one minute 20 seconds later (D) was added; 25 seconds later (E) was added; after an additional 15 seconds stirring was stopped. The product (precipitate and solution) was allowed to settle for 15 minutes, and was washed with water by decantation 5–6 times, until the silver nitrate test for chloride ion was negative. The product alloy was dried and was of finely divided particles having an irregular shape.

Examples 1–3

Alloys were prepared using the above process and the following proportions of Pt/Pd/Au:

| | Weight percent | | |
|---|---|---|---|
| | Pt | Pd | Au |
| Example: | | | |
| 1 | 10 | 20 | 70 |
| 2 | 15 | 25 | 60 |
| 3 | 7.5 | 22.5 | 70 |

The average surface area of the powders was about 12 $m.^2/g.$

Example 4

Metallizing compositions were prepared employing the finely divided metal alloy prepared in Example 1, dispersed in an inert liquid vehicle. The inert liquid vehicle consisted of hydrogenated rosin, ethyl hydroxy ethyl cellulose, and terpineol in a mixture of high flash naphtha and kerosene. In all of the examples, the weight ratio of alloy to vehicle was 50% alloy to 50% vehicle. Capacitors, comprising at least one electrode and at least one counterelectrode having a ceramic dielectric material between the electrode and counterelectrode, wherein the electrode and counterelectrode comprise an alloy which was prepared from applying and firing the alloy metallizing compositions of this invention, were produced. The metallizing compositions were screen-printed on polymethyl methacrylate (PMA) resin bonded ceramic sheets. The sheets contained 10% PMA and 90% of a titanate ceramic powder composed of 90% strontium, calcium and barium titanates and 10% bismuth stannate.

Electrode prints were applied to all of the sheets. For purposes of identification, the first electrode print is designated as the electrode; the second print is designated as counterelectrode, etc. The completed capacitor consisted of three layers of ceramic and two buried metal layers. The stack was carefully compressed under a hydrolic press at a pressure of about 10,000 p.s.i. Then the stack of sheets was fired to 1200° C. over a period of 16 hours to form a monolithic capacitor structure having a central dielectric layer 0.00625 cm. thick and 0.1225 $cm.^2$ in area. The appearance of the capacitors and test results obtained were as follows.

All capacitors were intact (no evidence of cracking or delaminating). The ceramic material had previously been tested using platinum electrodes and found to have a dielectric constant of 1200. Three capacitors from this test gave capacitance values and calculated dielectric constant as shown below.

| Capacitance (pf.): | Dielectric constant |
|---|---|
| 2092 | 1238 |
| 2181 | 1290 |
| 2011 | 1190 |

The invention claimed is:

1. In a screen printable alloy metallizing composition comprising an inert liquid vehicle having dispersed therein a finely divided noble metal alloy powder, the improvement comprising, as said powder, an alloy consisting essentially of, on a weight basis, 5–15% platinum, 15–30% palladium and 60–80% gold, wherein the alloy powder has an average surface area within the range 0.1–20 $m.^2/g.$, whereby conductor patterns are produced at lower firing temperatures.

2. A metallizing composition according to claim 1 wherein the alloy powder consists essentially of, on a weight basis, 5–15% platinum, 15–25% palladium and 60–70% gold.

3. A metallizing composition according to claim 1 which further comprises a finely divided inorganic binder powder wherein the inorganic binder is present in an amount within the range of 1–15% of the combined weight of alloy powder and an inorganic binder.

4. A metallizing composition according to claim 3 wherein said inorganic binder is barium titanate.

References Cited

UNITED STATES PATENTS

| | | | |
|---|---|---|---|
| 3,401,126 | 9/1968 | Miller et al. | 106—1 |
| 3,407,081 | 10/1968 | Ballard | 106—1 |
| 3,537,892 | 11/1970 | Milkovich et al. | 106—1 |

LORENZO B. HAYES, Primary Examiner

U.S. Cl. X.R.

117—124 C, 227; 252—514

Disclaimer 3,817,758.—*Oliver Alton Short*, Wilmington, Del. GOLD ALLOY METALLIZATIONS FOR CAPACITOR ELECTRODES. Patent dated June 18, 1974. Disclaimer filed Oct. 13, 1976, by the assignee, *E. I. Du Pont de Nemours and Company*.

Hereby enters disclaimer to all claims of said patent.

[*Official Gazette, April 8, 1980.*]